US009440293B2

(12) United States Patent
Senbokuya et al.

(10) Patent No.: US 9,440,293 B2
(45) Date of Patent: Sep. 13, 2016

(54) SURFACE COATING CUTTING TOOL

(71) Applicant: MITSUBISHI MATERIALS CORPORATION, Tokyo (JP)

(72) Inventors: Kazuaki Senbokuya, Naka-gun (JP); Yusuke Tanaka, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/383,028

(22) PCT Filed: Mar. 5, 2013

(86) PCT No.: PCT/JP2013/055924
§ 371 (c)(1),
(2) Date: Sep. 4, 2014

(87) PCT Pub. No.: WO2013/133251
PCT Pub. Date: Sep. 12, 2013

(65) Prior Publication Data
US 2015/0030401 A1 Jan. 29, 2015

(30) Foreign Application Priority Data

Mar. 5, 2012 (JP) .................................. 2012-047926
Mar. 1, 2013 (JP) .................................. 2013-040331

(51) Int. Cl.
*B23B 27/14* (2006.01)
*C23C 14/06* (2006.01)
(Continued)

(52) U.S. Cl.
CPC ............... *B23B 27/14* (2013.01); *B23B 51/00* (2013.01); *B23C 5/16* (2013.01); *C23C 14/0641* (2013.01); *C23C 14/14* (2013.01); *C23C 14/325* (2013.01); *C23C 14/505* (2013.01); *B23B 2222/28* (2013.01); *B23B 2224/00* (2013.01);
(Continued)

(58) Field of Classification Search
USPC .......... 51/307, 309; 428/325, 336, 697, 698, 428/699; 204/192, 192.15, 192.16
See application file for complete search history.

(56) References Cited

U.S. PATENT DOCUMENTS

2006/0177698 A1 8/2006 Yamamoto

FOREIGN PATENT DOCUMENTS

| CN | 101802247 A | 8/2010 |
|----|-------------|--------|
| CN | 102027564 A | 4/2011 |

(Continued)

OTHER PUBLICATIONS

International Search Report mailed May 14, 2013 for the corresponding PCT Application PCT/JP2013/055924.
(Continued)

*Primary Examiner* — Archene Turner
(74) *Attorney, Agent, or Firm* — Leason Ellis LLP

(57) ABSTRACT

A surface-coated cutting tool with a body and hard coating layer is provided. (a) The hard coating layer is made of a complex nitride layer of Al and Cr. (b) The hard coating layer deposited on a region from a cutting edge to a location 100 μm from the cutting edge toward an opposite side thereof has a granular crystal structure. The average grain size of granular crystals on a surface of the hard coating layer on the region is 0.2-0.5 μm. The average grain size of granular crystals at an interface between the cutting tool body and the hard coating layer on the region is smaller than the average grain size on the surface the hard coating layer in an extent of 0.02-0.1 μm. The crystal grain size length ratio of crystal grains whose size is 0.15-20% or less.

4 Claims, 5 Drawing Sheets

(51) Int. Cl.
  *B23B 51/00* (2006.01)
  *B23C 5/16* (2006.01)
  *C23C 14/14* (2006.01)
  *C23C 14/32* (2006.01)
  *C23C 14/50* (2006.01)

(52) U.S. Cl.
  CPC ........ *B23C2222/28* (2013.01); *B23C 2224/00* (2013.01); *Y10T 407/27* (2015.01)

(56) References Cited

FOREIGN PATENT DOCUMENTS

| JP | 05-345976 | * | 12/1993 |
| JP | 2003-165003 | A | 6/2003 |
| JP | 3700658 | B | 9/2005 |
| JP | 3969230 | B | 9/2007 |
| JP | 2008-296290 | A | 12/2008 |
| JP | 2009-082993 | * | 4/2009 |
| JP | 2009-220260 | A | 10/2009 |
| JP | 2010-094744 | * | 4/2010 |
| JP | 2011-067883 | A | 4/2011 |
| JP | 2011-218542 | A | 11/2011 |
| JP | 2012-024854 | A | 2/2012 |
| JP | 2012-030346 | A | 2/2012 |
| JP | 2015-020216 | A | 2/2015 |

OTHER PUBLICATIONS

Office Action mailed Aug. 5, 2015 for the corresponding Chinese Application No. 201380012750.4.
N. J. Fisch et al. "Current Drive in a Ponderomotive Potential with Sign Reversal", *Physical Review Letters*, Nov. 14, 2003, p. 40, vol. 91, No. 20.
Extended European Search Report mailed Dec. 4, 2015 for the corresponding European Application No. 13757399.4.
N. J. Fisch et al. "Current Drive in a Ponderomotive Potential with Sign Reversal", *Physical Review Letters*, Nov. 14, 2003, p. 40, vol. 91, No. 20 (Previously submitted on Jan. 20, 2016. Resubmission).

* cited by examiner

SURFACE COATING CUTTING TOOL

CROSS-REFERENCE TO RELATED PATENT APPLICATIONS

This application is a U.S. National Phase Application under 35 U.S.C. §371 of International Patent Application No. PCT/JP2013/055924, filed Mar. 5, 2013, and claims the benefit of Japanese Patent Application No. 2012-047926, filed Mar. 5, 2012, and Japanese Patent Application No. 2013-40331, filed Mar. 1, 2013, all of which are incorporated by reference in their entirety herein. The International Application was published in Japanese on Sep. 12, 2013 as International Publication No. WO/2013/133251 under PCT Article 21(2).

FIELD OF THE INVENTION

The present invention relates to a surface coating cutting tool (hereafter referred to as coated tool) which has a hard coating layer that shows excellent chipping resistance and abrasion resistance in cutting work on carbon steel, alloy steel, or the like.

BACKGROUND OF THE INVENTION

In general, there are through-away chips, drills, solid-type end mills, and the like, as coated tools. Through-away chips are used by being attached detachably to the front end portion of a bite in lathe turning machining and planning machining of a work made of various steels, cast ions, or the like. Drills are used in drilling cutting machining or the like of the work. The solid-type end mills are used in facing cutting machining, grooving machining, shoulder machining, or the like of the work. In addition, thorough-way end mill tools, which are used by being attached detachably as in the above-mentioned through-away chips in cutting machining as in the above-mentioned solid-type end mills, are known.

For example, a coated tool, in which a hard coating layer made of a complex nitride layer of Al and Cr (indicated by (Al, Cr)N hereinafter) is vapor deposited on the body (referred as cutting tool body herein after) made of tungsten carbide (referred as WC herein after)-based cemented carbide, is known as a coated tool as indicated in Patent Literature 1 (PTL 1). The conventional coated tool shows excellent cutting performance since the above-described (Al, Cr)N layer constituting the hard coating layer has excellent high-temperature hardness, heat resistance, high-temperature strength, high-temperature oxidization resistance, and the like.

Also, it is known that the conventional coated cool can be manufactured by following procedure described below. First, the cutting tool body is inserted in an arc ion plating apparatus which is one of physical vapor deposition apparatuses as shown in FIGS. 1A and 1B. Second, arc discharge is generated in the condition in which electric current is 90 A between the anode electrode and the cathode electrode on which Al—Cr alloy with a predetermined composition is set in a condition in a state where the cutting tool body is heated to 500° C. by a heater. Simultaneously, nitrogen gas is introduced in the apparatus as reaction gas to obtain reaction atmosphere of 2 Pa. In regard to the cutting tool body, the above-described (Al, Cr)N layer is vapor deposited on the surface of the cutting tool body in a condition where bias voltage of −100V is applied.

In these coated cutting tool, in order to improve their cutting performance, particularly chipping resistance, abrasion resistance, and the like, various sorts of proposals on the structure of the hard coating layer were made.

For example, a coated tool (end mill), in which fracturing resistance is improved by suppressing fracturing of the coating layer on the rake face and abrasion resistance on flank face is further improved, is disclosed in Patent Literature 2 (PTL 2). In the coated tool (end mill) disclosed in PTL 2, the coating layer is constituted by columnar crystals: the coating layer on the rake face is thinner than the coating layer on the flank face: the coating layer is made of two layers, and the average crystal width in the upper layer region on the surface side of the coating layer is larger than that of the lower layer region on the body side of the coating layer: the ratio of the upper layer region to the coating layer on the rake face is less than that on the flank face: the average columnar crystal width on the rake face is less than that on the flank face.

Also, for example, a coated tool, in which abrasion resistance and toughness is balanced at a high level, is disclosed in Patent Literature 3 (PTL 3). The coated tool disclosed in PTL 3 has s coating film with excellent adhesiveness to the body. In the coated tool disclosed in PTL 3, the coating film formed on the body includes the first coating film layer: the first film layer includes the micro-structure region and the coarse-structure region: the average crystal size of the composition constituting the micro-structure region is 10-200 nm: the micro-structure region occupies the range corresponding to the thickness of 50% or more of the total thickness of the first coating film layer from the surface side of the first coating film layer: the micro-structure region has the average compressive stress of −4 GPa or more and −2 GPa or less: the first coating film layer has stress distribution in its thickness direction: there are 2 or more maximum values and minimum values in the stress distribution: the closer to the surface side in the thickness direction, the higher the maximum and the minimum values of the compressive stress.

RELATED ART DOCUMENTS

Patent Literature

PTL 1: Japanese Patent (Granted) Publication No. 3969230 (B)
PTL 2: Japanese Unexamined Patent Application, First Publication No. 2008-296290 (A)
PTL 3: Japanese Unexamined Patent Application, First Publication No. 2011-67883 (A)

Problems to be Solved by the Present Invention

In recent years, the performance of the cutting machines is significantly improved. On the other hand, there is a strong demand for labor-saving, energy-saving and reducing cost in the cutting work. In responding to the demand, the cutting work has been performed in an even more severe condition.

In the above-mentioned conventional coated tools, chipping resistance, fracturing resistance, and abrasion resistance are improved in a certain extent. However, when they are used in cutting work of carbon steel, alloy steel, or the like in the even more severe condition, they are chipped easily or the wear due to abrasion increases. Thus, the conventional coated tools reach to the tool life in a relatively short period of time in the present circumstance.

Means to Solving the Problems

Under the circumstance described above, the inventors of the present invention conducted an intensive study on the structure of the crystal texture of the hard coating layer in order to provide a coated tool that has excellent chipping resistance and abrasion resistance to exhibit excellent cutting performance in usage for a long period of time in cutting work on carbon steel, alloy steel, or the like. Followings are the findings the inventors made in the study.

Conventionally, when the coated tools are produced, CVD method, PVD method, and the like are commonly utilized as a method for forming the hard coating layer. For example, when the hard coating layer made of (Al,Cr)N is deposited by the arc ion plating method (referred as AIP method hereinafter), which is one of PVD method, the hard coating layer is deposited by: inserting the cutting tool body in the apparatus; applying the predetermined bias voltage and forming arc discharge between the anode electrode and the Al—Cr alloy target with a predetermined composition in a condition where the inside of the apparatus is heated to a predetermined temperature at the same time; introducing nitrogen gas as a reaction gas simultaneously in the apparatus; and vapor-depositing the layer in a reaction atmosphere at a predetermined pressure.

The inventors of the present invention studied to investigate the effect of magnetic field on the structure of the hard coating layer by applying magnetic field between the cutting tool body and the target during deposition of the hard coating layer made of (Al, Cr)N in the above-mentioned conventional AIP method. As a result, the inventors found the following:

By performing deposition of the hard coating layer by AIP method in magnetic field of predetermined magnetic field intensity, the size of granular crystal grains constituting the hard coating layer can be adjusted. Also, the value of residual stress formed within the hard coating layer can be regulated. Furthermore, the crack occupancy ratio of a continuous crack formed in the corner portion in the front-end cutting edge can be adjusted. The coated tool having the hard coating layer made of (Al, Cr)N optimized in: the crystal grain size; the residual stress value; and the crack occupancy ratio in the hard coating layer as explained above exhibits excellent chipping resistance and abrasion resistance in the cutting work on carbon steel, alloy steel, or the like. As a result, the coated tool exhibits excellent cutting performance in usage for a long period of time.

SUMMARY OF THE INVENTION

The present invention is made based on the findings described above, and has aspects shown below.

(1) A surface-coated cutting tool including: a cutting tool body made of tungsten carbide-based cemented carbide; and a hard coating layer that has an average thickness of 2 µm to 10 µm and is vapor-deposited on a surface of the cutting tool body, wherein (a) the hard coating layer is made of a complex nitride layer of Al and Cr, a Cr content of which with respect to a total amount of Al and Cr is 0.2 to 0.5 in atomic ratio; and (b) a part of the hard coating layer, which is vapor deposited on a region on a flank face from a cutting edge on the flank face of the cutting tool body of the surface-coated cutting tool to a location 100 µm from the cutting edge on the flank face toward an opposite side thereof, has a granular crystal structure: an average grain size of granular crystals on a surface of the part of the hard coating layer formed on the region is 0.2 µm to 0.5 µm; an average grain size of granular crystals at an interface between the cutting tool body and the part of the hard coating layer on the region is smaller than the grain size of granular crystals on the surface of the part of the hard coating layer in an extent of 0.02 µm to 0.1 µm; a crystal grain size length ratio of crystal grains whose size is 0.15 µm or less is 20% or less.

(2) The surface-coated cutting tool according to (1) described above, wherein a compressive residual stress in the hard coating layer is 2.0 to 2.7 GPa.

(3) The surface-coated cutting tool according to (1) or (2) described above, wherein a crack occupancy ratio β/α is 0.3 to 1.0, α being an angle of the cutting edge of the surface-coated cutting tool in degree, and β being an occupied angle of an continuous crack formed in the hard coating layer in a corner portion of a front-end cutting edge within the angle defined by α.

(4) The surface-coated cutting tool according to any one of (1) to (3) described above, wherein an aspect ratio of crystal grains included in the granular crystal structure is 1 or more and 6 or less.

(5) A method of producing a surface-coated cutting tool having a cutting tool body, which is made of tungsten carbide-based cemented carbide, and a hard coating layer, which has an average thickness of 2 µm to 10 µm and is vapor-deposited on a surface of the cutting tool body, the method including the steps of:

inserting the cutting tool body made of tungsten carbide-based cemented carbide in an arc ion plating apparatus with an anode electrode, a target made of Al—Cr alloy, and a magnetic force generating source provided to a back side of the target; and vapor-depositing the hard coating layer made of a complex nitride layer of Al and Cr on the cutting tool body, wherein the step of vapor-depositing includes the steps of:
introducing nitrogen gas in the arc ion plating apparatus;
forming a magnetic field between the target and the cutting tool body by the magnetic force generating source;
generating arc discharge between the target and the anode electrode while bias voltage is applied on the cutting tool body; and
rotating and revolving the cutting tool body in the arc ion plating apparatus, and
a part of or an entire flank face of the cutting tool body and a surface of the target facing the cutting tool body are supported to be aligned in parallel when the cutting tool body and the target come closest.

(6) The method of producing surface-coated cutting tool according to (5) described above, wherein the magnetic field is set to 140 to 400 mT×mm as an integrated magnetic force.

Effects of the Invention

The coated tool, which is an aspect of the present invention (hereinafter referred to as a coated tool of the present invention), exhibits excellent chipping resistance and abrasion resistance in the cutting work on carbon steel, alloy steel, or the like, and exhibits excellent cutting performance in usage for a long period of time, since: the hard coating layer made of the (Al, Cr)N layer with a predetermined composition is constituted from the granular crystal structure in the range from the cutting edge to the location 100 µm from the cutting edge: the grain size on the surface of the hard coating layer is 0.2-0.5 µm: the grain size at the interface is smaller than the grain size on the surface of the hard coating layer in an extent of 0.02-0.1 µm: the crystal grain size length ratio of crystal grains whose size is 0.15 µm or less is 20% or less in the range from the cutting edge on the flank face to the location 100 µm from the cutting edge on the flank face: the compressive residual stress in the hard coating layer is 2.0-2.7 GPa: the crack occupancy ratio in the cutting edge β/α is 0.3-1.0.

BRIEF DESCRIPTION OF THE DRAWINGS

FIG. 4A is a cross-sectional SEM image (magnification: 10000-fold) of the hard coating layer including the corner portion of the front-end cutting edge.

FIG. 4B is a schematic drawing of the cross-sectional SEM image indicated in FIG. 4A.

DETAILED DESCRIPTION OF THE INVENTION

Embodiments of the coated tool of the present invention are explained in detail in reference to the drawings.

Figure 3A:
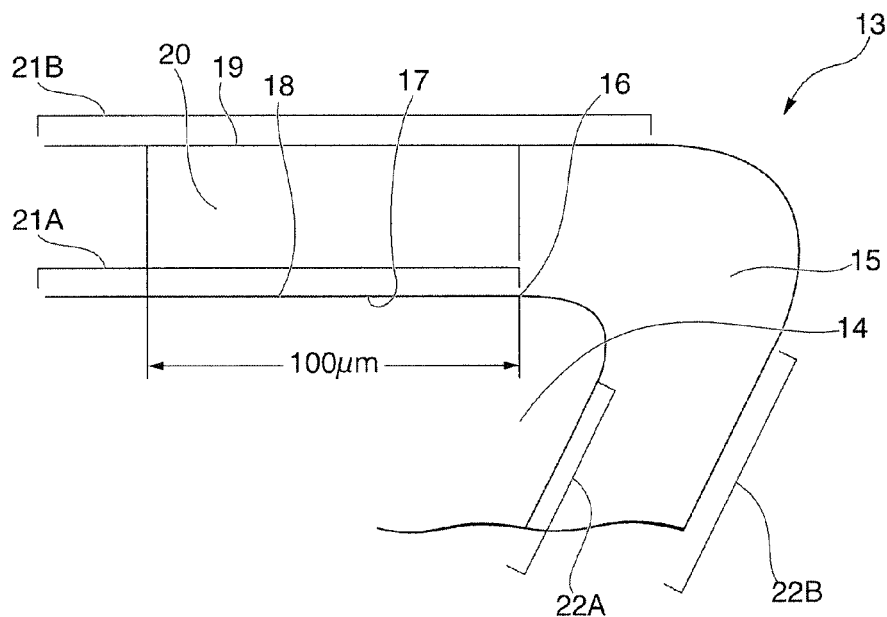
FIG. 3A is a vertical cross-sectional view of a coated tool which is an aspect of the present invention.

FIG. 3A is a vertical cross-sectional view of a coated tool which is an aspect of the present invention. As shown in FIG. 3A, the hard coating layer 15 is formed on the cutting tool body 14 in the coated tool 13 of the present invention. The cutting edge part is formed between the flank face 21 and the rake face 22 of the coated tool 13.

(a) Type of the Hard Coating Layer, the Average Layer Thickness:

The hard coating layer 15 of the coated tool 13 of the present invention is made of a complex nitride layer of Al and Cr ((Al, Cr)N layer).

The (Al, Cr)N layer is known as a hard coating layer having excellent high-temperature hardness, heat resistance, high-temperature strength, and high-temperature oxidization resistance, since it improves: high-temperature hardness and heat resistance by Al component; high-temperature strength by Cr component; and high-temperature oxidization resistance by co-existence of Cr and Al.

In the case where the content ratio of Cr (atomic ratio, hereinafter the same) among the total quantity with Al is less than 0.2, it becomes difficult to retain the high-temperature strength during cutting work. In the case where the content ratio of Cr (atomic ratio) among the total quantity with Al is more than 0.5, the content ratio of Al is reduced relatively causing reduced high-temperature hardness and heat resistance. As a result, abrasion resistance is deteriorated due to occurrence of uneven abrasion, thermal plastic deformation, or the like. Because of the reason described above, the Cr content ratio (atomic ratio) among the total quantity with Al is set to 0.2-0.5 in the hard coating layer 15 in the coated tool of the present invention. It is preferable to set the Cr content to 0.22-0.45. More preferably, it may be set to 0.25-0.42.

In the case where the average layer thickness of the hard coating layer made of the (Al, Cr)N layer is less than 2 µm, the coated tool cannot exhibit excellent abrasion resistance for a long period of time to cause shortening of the service life of the tool. In the case where the average layer thickness of the hard coating layer exceeds 10 µm, chipping occurs easily in the cutting edge part. Because of the reason described above, the average layer thickness of the hard coating layer 15 of the coated tool 13 of the present invention is set to 2 to 10 µm. It is preferable that the average layer thickness of the hard coating layer 15 is set to 2.5-9 µm. More preferably, it may be 3-8 µm.

(b) Layer Structure of the Hard Coating Layer Made of the (Al, Cr)N Layer

In the coated tool 13 of the present invention, the compressive residual stress in the hard coating layer is reduced by further forming the hard coating layer with special characteristics in a specific region on the flank face 21.

The specific region on the flank face means the region 17 from the cutting edge 16 on the flank face to the location 100 µm from the cutting edge 16 on the flank face toward an opposite side thereof on the flank face. The hard coating layer 20 formed on the region 17 has the characteristics explained below.

The hard coating layer 20 made of the (Al, Cr)N layer is deposited as granular crystals. Also, the average crystal grain size in the crystal grains on the surface 19 of the hard coating layer 20 (simply referred as "surface grain size" hereinafter) is set to 0.2-0.5 µm. On the other hand, the average crystal grain size of the hard coating layer 20 at the interface 18 between the cutting tool body 14 and the hard coating layer 20 (simply referred as "interface grain size" hereinafter) is set to a value smaller than that of the surface grain size in the extent of 0.02-0.1 µm. In other words, the structure of the crystal texture of the hard coating layer 20 is formed on the region 17 so that the surface grain size and the interface grain size are set to the different ranges. Because of this, the hard coating layer 20 is deposited in such a way that the compressive residual stress in the hard coating layer is kept in a predetermined numerical range.

The crystal grains of the hard coating layer "at the interface between the cutting tool body and the hard coating layer" means crystal grains formed in the hard coating layer ranging from the interface between the cutting tool body 14 and the hard coating layer 20 to the region toward the hard coating layer in the thickness of 0.5 µm. Also, the crystal grains "on the surface of the hard coating layer" means crystal grains formed in the hard coating layer from the surface of the hard coating layer 20 to region toward the hard coating layer in the thickness of 0.5 μm.

The term "granular crystal" is for distinguishing from "columnar crystal", and specifically means the crystal whose aspect ratio is 1 or more and 6 or less. The aspect ratio can be calculated by dividing the minor axis with the major axis of the crystal grain, the major axis being the longest axis (long side) in the cross section of the crystal grain, and the minor axis (short side) being the vertical axis to the major axis.

Detail explanations about the average crystal grain size (and effects thereof) are shown below.

When the average crystal grain size of the crystal grains on the surface of the hard coating layer 19 (surface grain size) is less than 0.2 μm, chipping during cutting work easily occurs since the compressive residual stress in the hard coating layer increases. On the other hand, when the surface grain size exceeds 0.5 μm, the flank width increases because of wear due to the reduced compressive residual stress. As a result, the coated tool cannot exhibit sufficient abrasion resistance in usage for a long period of time. Because of the reasons described above, the surface grain size is set to 0.2-0.5 μm in the hard coating layer 20 of the coated tool 13 of the present invention.

It is necessary that the average crystal grain size of the crystal grains of the hard coating layer 20 at the interface 18 between the cutting tool body 14 and the hard coating layer 20 (interface grain size) is set to a value smaller than the average surface grain size in an extent of 0.02-0.1 μm. The technical reasons for the configuration are as follows. When the average interface grain size is smaller than the average surface grain size in an extent exceeding 0.1 embrittlement of the entire film occurs since the difference of the compressive residual stresses in each part increases due to widening the difference between the surface grain size and the average interface grain size. Therefore, wearing or chipping occurs easily during cutting work to cause the problem of deteriorated cutting performance.

On the other hand, when the average interface grain size is smaller than the average surface grain size but the difference between the surface grain size and the interface grain size is less than 0.02 μm, the compressive residual stresses on the surface and the interface become almost equivalent. In that case, the benefit of improved abrasion resistance cannot be obtained during cutting work.

In the present invention, by setting the average interface grain size smaller than the average surface grain size in the extent of 0.02-0.1 μm, the compressive residual stress is set to a higher value on the interface side in an extent of which embrittlement of the entire film does not occur. Thus, wearing on the interface side can be suppressed after the surface of the film is worn out during performing cutting for a long period of time.

The method of grain size measurement is explained below in reference to FIG. 3B. First, the cross section on the flank face side is hewed out from the cutting edge of the cutting tool body. Then, the cross section is observed by SEM. Then, by drawing a straight line parallel to the surface of the cutting tool body on each of crystal grains formed in the region from the surface of the hard coating layer 19 to the depth region of 0.5 μm, the distance between crystal grain boundaries and crystal sizes are determined. The location where the straight line parallel to the surface of the cutting tool body is drawn is the location where the longest crystal grain size can be obtained in each of crystal grains. Crystal grain sizes are measured in the region 17 from the cutting edge on the flank face 16 to the location 100 μm from the cutting edge on the flank face 16. Then the average value of the measured values is defined as the surface grain size. More specifically, the measurement of the average crystal grain size is made at three locations on the crystal grains existing in the width range of 10 μm (the locations indicated by dotted lines in the hard coating layer 20 in FIG. 3B). The three locations locate on: the cutting edge 16 on the flank face; the location 50 μm from the cutting edge 16 on the flank face; and the location 100 μm from the cutting edge 16 on the flank face. Then the average value of average grain sizes obtained at the three locations is defined as the average surface grain size. Also, the average interface grain size of crystal grains formed in the hard coating layer ranging from the interface between the cutting tool body 14 and the hard coating layer 20 to the region toward the hard coating layer in the thickness of 0.5 μm is calculated in the same way.

Also, it is necessary that a crystal grain size length ratio of crystal grains whose size is 0.15 μm or less is 20% or less in both of the surface and interface grain sizes on the region 17 from the cutting edge 16 on the flank face to the location 100 μm from the cutting edge 16 on the flank face (exact locations for the measurements are the three locations: the cutting edge on the flank face; the location 50 μm from the cutting edge on the flank face; and the location 100 μm from the cutting edge on the flank face). The reason for this configuration is that the compressive residual stress in the hard coating layer increases for chipping to occur easily when the micro-crystal grains having their grain sizes of 0.15 μm or less are formed in the ratio exceeding 20%.

The crystal grain size length ratio of crystal grains whose size is 0.15 μm or less means the ratio of the sum of the lengths of the crystal gain sizes having a grain size of 0.15 μm or less with respect to the sum of the total lengths of all of the measured crystal grain sizes when grain sizes are measured on multiple crystal grains.

Figure 3B:
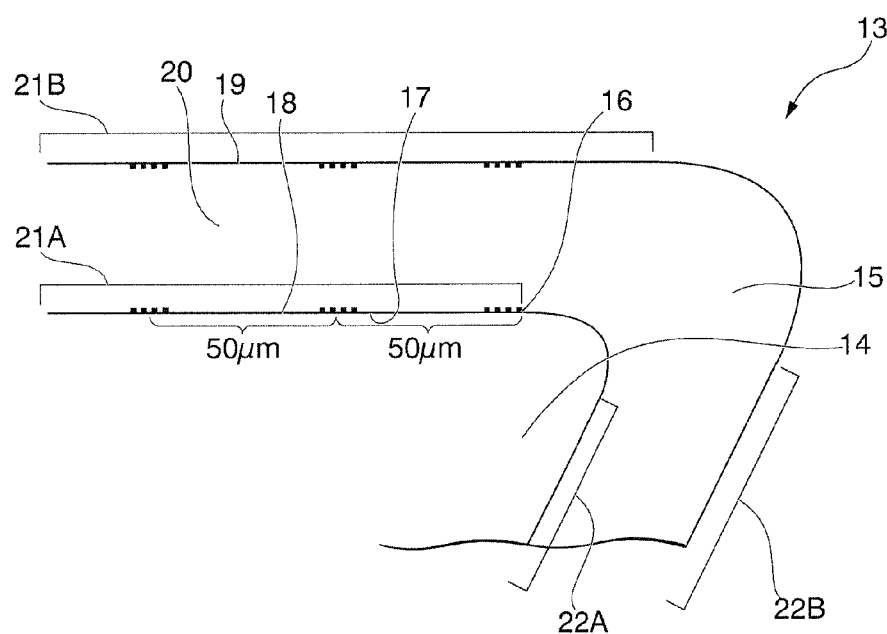
FIG. 3B is a vertical cross-sectional view of a coated tool which is an aspect of the present invention, and indicates the measurement positions of grain sizes on the surface of the hard coating layer vapor deposited on the region from the cutting edge on the flank face to the location 100 µm from the cutting edge or the interface between the hard coating layer and the body.

In the present invention, "the cutting edge" is defined as "the part closest to the front tip of the coated tool on the liner-shaped cutting edge excluding the conic-shaped part of the corner part of the front-end cutting edge" as shown in FIGS. 3A and 3B.

Figure 3C:
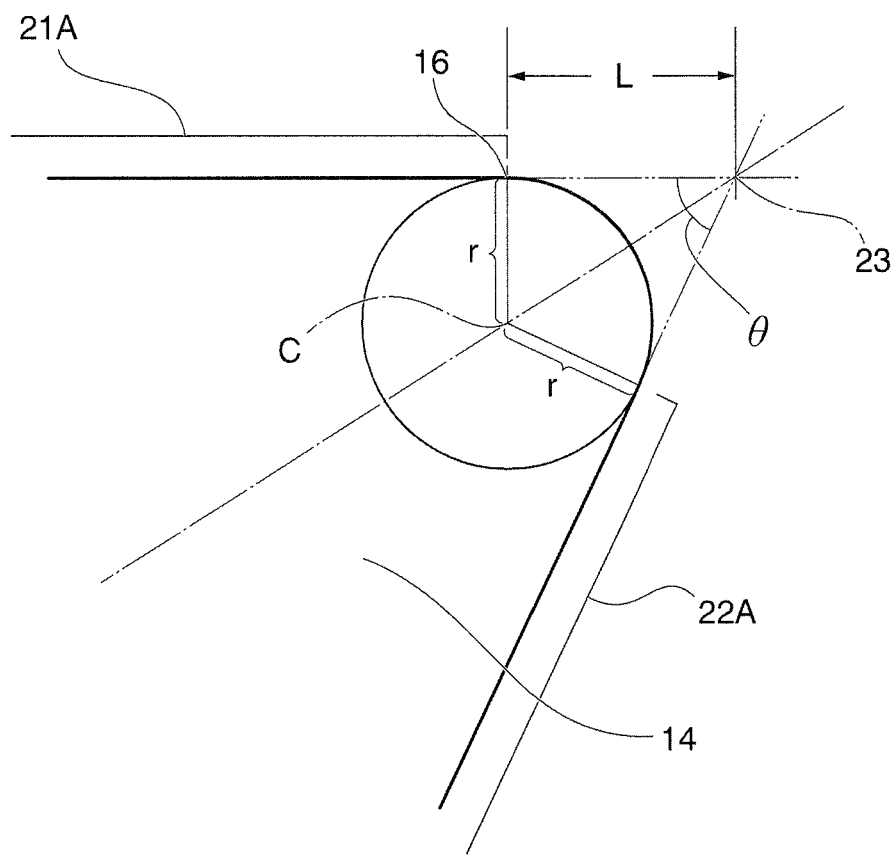
FIG. 3C is a vertical cross-sectional view of a coated tool which is an aspect of the present invention, and indicates the positional relationship between: the intersection between the extended imaginary lines of the flank and rake faces on cutting tool body; and the cutting edge on the flank face.

FIG. 3C indicates a vertical cross-sectional view of a coated tool which is an aspect of the present invention, and indicates the positional relationship between: the intersection between the extended imaginary lines of the flank and rake faces on cutting tool body; and the cutting edge on the flank face. In FIG. 3C, only the cutting tool body is shown and the hard coating layer is not shown.

As shown in FIG. 3C, there is a relationship between: the intersection 23 of the extended imaginary lines of the flank face of the body and the rake face of the body; and the length L (μm) from the intersection 23 to the cutting edge 16 on the flank face, which is described below.

The relationship is expressed by the formula "L=r/tan (0.5×θ)", wherein L, r, and θ indicating the length from the intersection 23 to the cutting edge 16 on the flank face, the radius (μm) of the arc of the corner part, and the angle (°) formed between the virtual extended lines of the flank face of the body and the rake face of the body, respectively.

In the present invention, the compressive residual pressure of 2.0-2.7 GPa can be generated in the hard coating layer by coating the (Al, Cr)N layer made of the layer structure configured as in (b) described above on the region 17 as the hard coating layer 20. When the value of the compressive residual stress is less than 2.0 GPa, abrasion resistance cannot be obtained. On the other hand, when the residual compressive stress exceeds 2.7 GPa, chipping occurs easily. Thus, it is preferable that the compressive residual stress in the hard coating layer is set 2.0-2.7 GPa in the present invention.

Figure 4A:
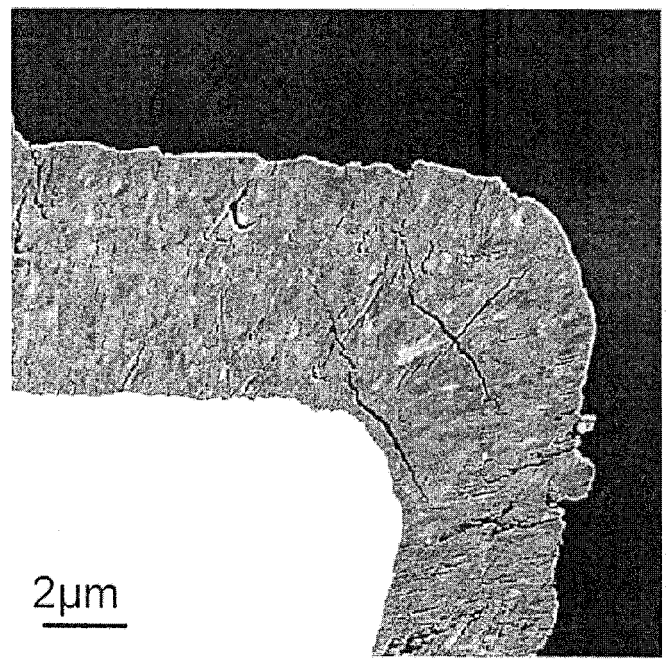
FIG. 4A is a drawing for explaining the relationship among the angle of cutting edge α, the occupied angle of a continuous crack, and the crack occupancy ratio of the coated tool of the present invention.
Figure 4B:
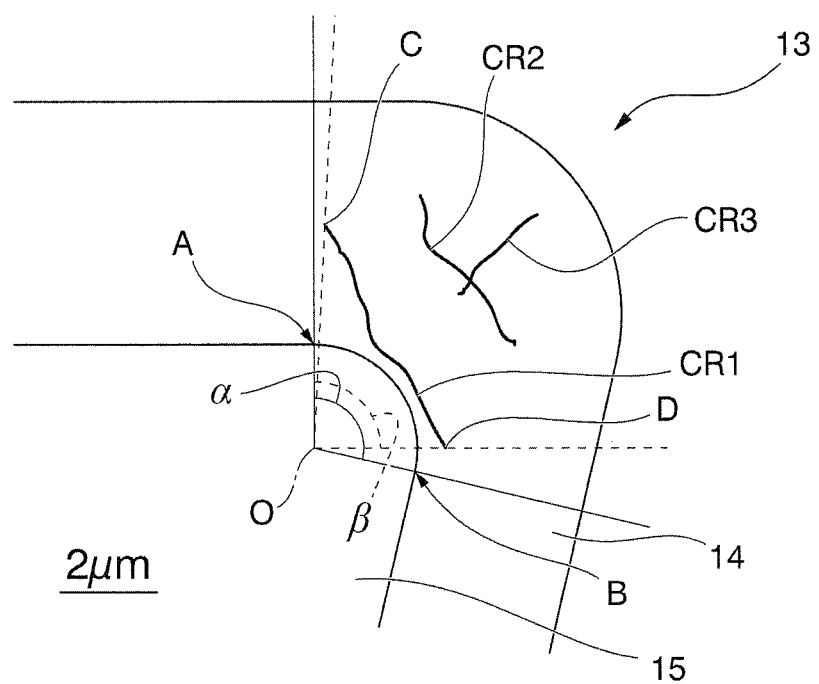
FIG. 4B is a drawing for explaining the relationship among the angle of cutting edge α, the occupied angle of a continuous crack, and the crack occupancy ratio of the coated tool of the present invention.

In the coated tool 13 of the present invention, it is preferable that the crack occupancy ratio β/α is 0.3 to 1.0, α being the angle of cutting edge of the surface-coated cutting tool in degree, and β being the occupied angle of an continuous crack formed in the hard coating layer in a corner portion of a front-end cutting edge within the angle defined by α as shown in FIGS. 4A and 4B. More preferably, β/α is 0.3 to 0.9.

The reason for the above-described configuration is as follows.

When a hard coating layer is formed on the surface of the cutting tool body using an arc ion plating apparatus (AIP apparatus), the compressive residual stress is accumulated in the layer. Especially in the layer with large crystal grain sizes, the compressive residual stress is concentrated on the crystal grain boundaries. Such crystal grain boundaries become starting points of cracking easily.

However, according to the coated tool 13 of the present invention, the crack C is formed in the hard coating layer at the corner part of the front-end cutting edge in advance. Thus, extent of concentration of the residual pressure is reduced. As a result, deterioration of the cutting performance due to occurrence of chipping or the like in the early stage at the beginning of cutting can be suppressed.

However, in the case where β/α is less than 0.3, the inhibitory effect of the concentration of the compressive residual stress cannot be obtained. Thus, β/α is set to 0.3 or higher.

From the point of view of the inhibitory effect of concentration of the compressive residual stress, there is no need to set an upper limit to the β/α value (that is, β/α is 0.3-1.0). However, the closer the β/α value to 1.0, the easier for interfacial delamination between the hard coating layer and the cutting tool body to occur. Thus, it is preferable that the β/α value is set to 0.3-0.9. More preferable range of the β/α value is 0.4-0.85.

The definition of the crack in the present invention is explained below.

The crack in the present invention means the crack formed in the hard coating layer including the corner part of the front-end cutting edge. Existence of the crack can be confirmed, for example, by observing an SEM image of the cross section of the coated tool at a magnification of 10000 times, for example. The crack in the present invention means the crack whose width is 30 nm or more. The end point of the crack is defined as the point where the width of the crack is narrowed down less than 30 nm when the width of the crack becomes narrower at the end part.

The crack occupancy ratio is defined as explained below in the present invention.

The angle formed by A-O-B is defined as the angle of cutting edge α (°), the center O being the intersection of the perpendicular line passing thorough the cutting edge A on the flank face and the perpendicular line passing through the cutting edge B on the rake face as shown in FIGS. 4A and 4B.

Also, in regard to the continuous crack formed in the hard coating layer of the corner part of the front-end cutting edge, the angle formed by C-O-D is defined as the occupied angle of the continuous crack angle β (°), when the lines touching the ends C and D of the continuous single crack are drawn from the center O. In the case where multiple cracks are formed in the hard coating layer of the corner part of the front-end cutting edge, the continuous crack with the largest occupied angle is used.

The crack occupancy ratio is defined as the value (Occupied angle of a continuous crack β)/(Angle of cutting edge α).

In the coated tool of the present invention, the average layer thickness of the hard coating layer made of the (Al, Cr)N layer is set to 2-10 μm, and the Cr content of the hard coating layer with respect to the total amount of Al and Cr is set to 0.2-0.5 in atomic ratio. In addition, the surface grain size and the interface grain size of the granular crystal grains are set to specific numerical ranges. Furthermore, the crystal grain size length ratio of crystal grains whose size is 0.15 μm or less is 20% or less on the region 17 from the cutting edge 16 on the flank face to the location 100 μm from the cutting edge 16. Because of having the configurations described above, the coated cutting tool, in which the value of the compressive residual stress in the hard coating layer is 2.0-2.7 GPa and the crack occupancy ratio β/α in the cutting edge is 0.3 to 1.0, can be produced efficiently.

(c) Deposition of the Hard Coating Layer

Figure 1A:
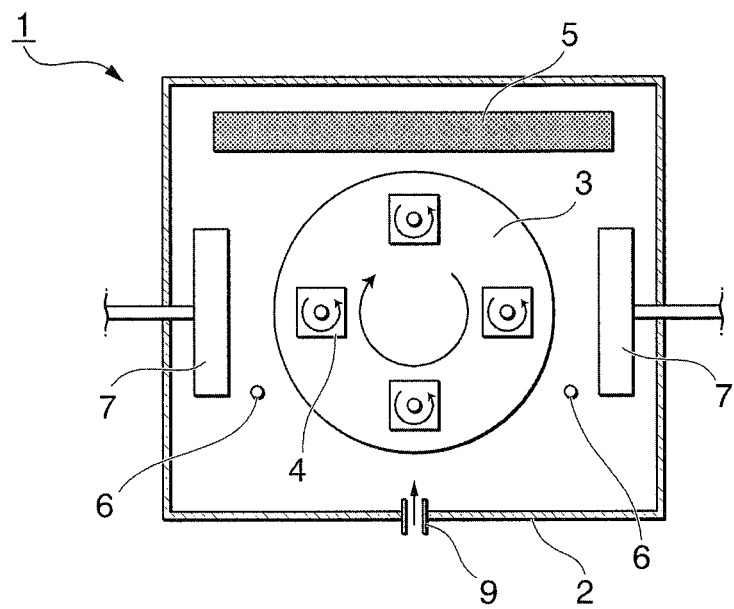
FIG. 1A is a schematic view of a conventional AIP apparatus and shows a plan view.
Figure 1B:
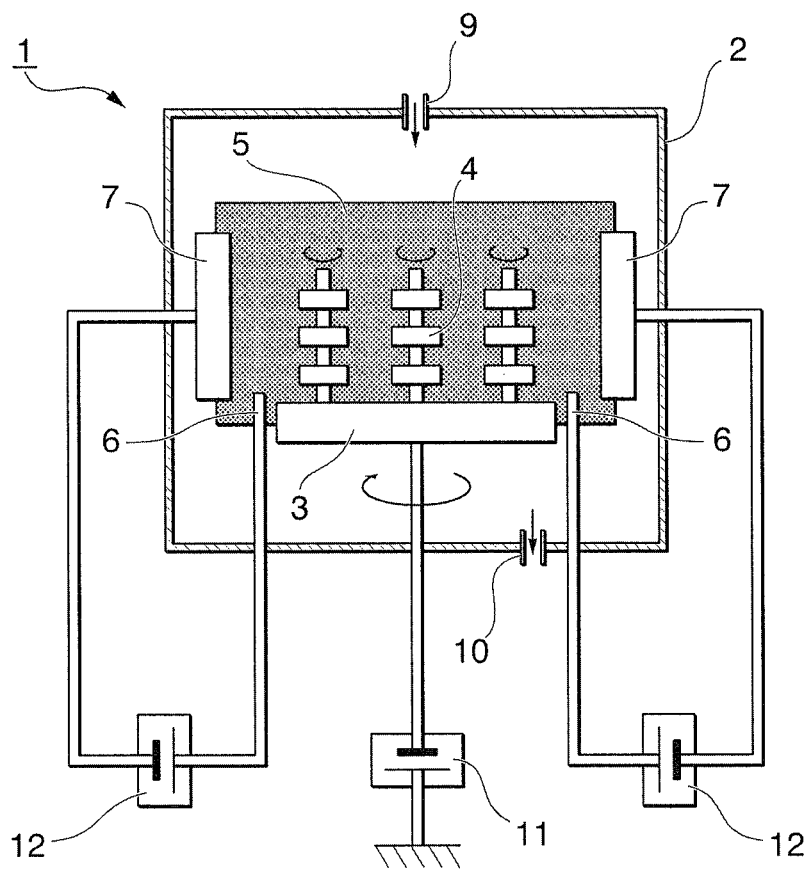
FIG. 1B is a schematic view of a conventional AIP apparatus and shows a side view.
Figure 2A:
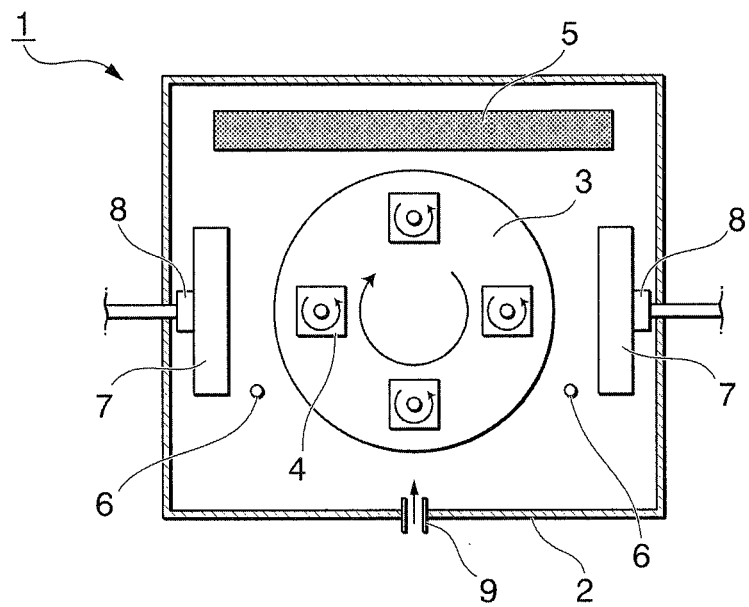
FIG. 2A is a schematic view of the AIP apparatus for producing the coated tool of the present invention, and shows a plan view.
Figure 2B:
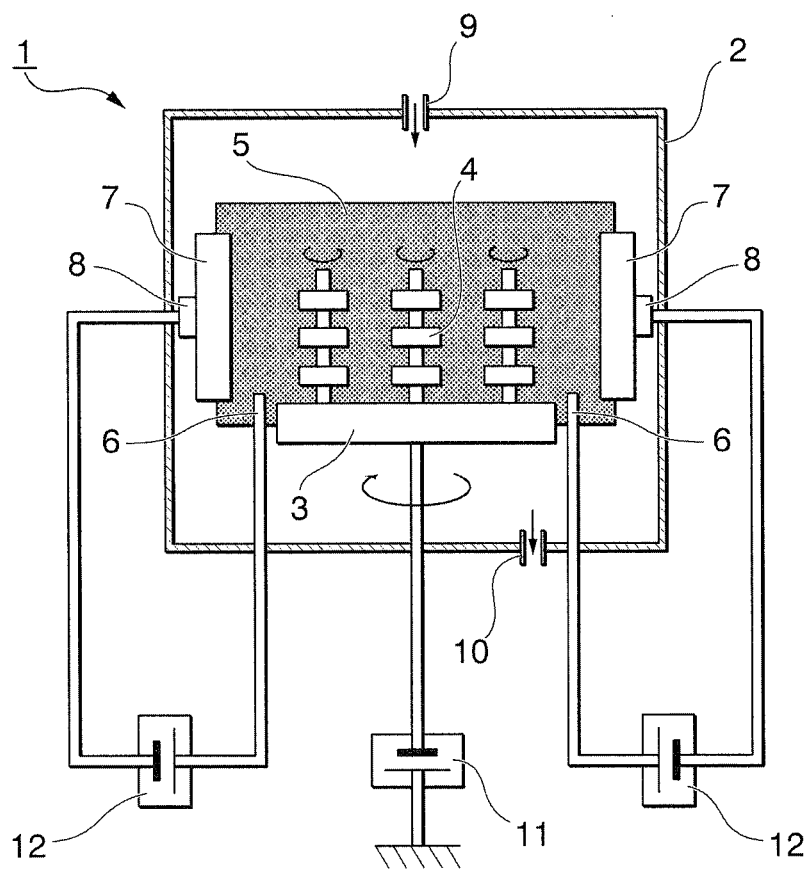
FIG. 2B is a schematic view of the AIP apparatus for producing the coated tool of the present invention, and shows a side view.

The hard coating layer of the coated tool of the present invention can be formed by: rotating and revolving the cutting tool body in AIP apparatus while the temperature of the cutting tool body is kept at 370-450° C.; and vapor-depositing the hard coating layer while the magnetic field of a predetermined intensity (140-400 mT×mm as the integrated magnetic force) is applied between the center of the target surface and the cutting tool body positioned at the location closest to the target, by using the arc ion plating apparatus (AIP apparatus) as shown in FIGS. 2A and 2B.

For example, a cathode electrode, which is for cleaning the cutting tool body and made of Ti electrode, is provided on one side of AIP apparatus, and a target (cathode electrode) made of Al—Cr alloy is provided on other side of AIP apparatus. A preferable Al content in the Al—Cr alloy is 55 at % Al-78 at % Al. A preferable Cr content in the Al—Cr alloy is 22 at % Cr-45 at % Cr. For example, a target (cathode electrode) made of 70 at % Al-30 at % Cr alloy is provided.

First, the cutting tool body made of tungsten carbide (WC)-based cemented carbide is washed and dried. Then, it is mounted on the rotating table in AIP apparatus. Then, arc discharge of 100 A is formed between the Ti electrode for cleaning the cutting tool body and the anode electrode in vacuum. Then, the surface of the cutting tool body is bombard-cleaned while bias voltage of −1000V is applied to the cutting tool body.

Next, the magnetic field is applied in such a way that the integrated magnetic force between the center of the Al—Cr alloy target surface and the cutting tool body positioned at the location closest to the target becomes 140-400 mT×mm Next, nitrogen gas is introduced in the apparatus as a reaction gas. Because of this, the atmospheric pressure in the apparatus is kept in the range of 9.0 Pa-9.6 Pa. For example, the atmospheric pressure is set to 9.3 Pa. In addition, the temperature of the cutting tool body is kept at 370-450° C., and arc discharge of 100 A is formed between Al—Cr alloy target (cathode electrode) and the anode electrode while bias voltage of −50V is applied to the cutting tool body. The hard coating layer of the coated tool 13 of the present invention can be vapor-deposited by: supporting the cutting tool body in such a way that a part of or the entire flank face of the cutting tool body and the surface of the target are aligned in parallel when the cutting tool body is positioned closest to the target; and vapor-depositing the hard coating layer while the cutting tool body is rotated and revolved.

For forming the magnetic field between the Al—Cr alloy target and the cutting tool body, any mean can be utilized. For example, a magnetic field generating source such as a magnetic coil or a permanent magnet can be provided in the vicinity of the cathode. Alternatively, a permanent magnet can be provided in the central part in AIP apparatus.

Next, the coated tool of the present invention is explained specifically by Examples.

EXAMPLE 1

As raw material powders: the medium-coarse WC powder with the average grain size of 5.5 μm; the fine WC powder with the average grain size of 0.8 μm; the TaC powder with the average grain size of 1.3 μm; the NbC powder with the average grain size of 1.2 μm; the ZrC powder with the average grain size of 1.2 μm; the $Cr_3C_2$ powder with the average grain size of 2.3 μm; the VC powder with the average grain size of 1.5 μm; the (Ti, W)C powder (TiC/WC=50/50 at a mass ratio) with the average grain size of 1.0 μm; and the Co powder with the average grain size of 1.8 μm, were prepared. The above-mentioned powders were blended as in each of the blending compositions shown in Table 5. Then, wax was added to the blended mixtures. Then, the mixtures were further mixed in acetone by a ball mill for 24 hours. Then, the mixtures were dried under reduced pressure. Then, the mixtures were extrusion press molded at a pressure of 100 MPa into each of green compacts with a predetermined shape. The temperature of the obtained green compacts was raised to a predetermined temperature ranging from 1370° C. to 1470° C. at a rate of 7° C./min under a vacuum atmosphere of 6 Pa. After keeping the green compacts at the temperature for 1 hour, they were sintered at the furnace cooling condition to form the round bar-shaped sintered bodies for the cutting tool body having the diameter of 10 mm. Then, cutting tool bodies 1-5 made of WC-based cemented carbide were produced from each of the round bar-shaped sintered bodies by grinding process. The cutting tool bodies (end mill) 1-3 had a cutting edge dimension of 6 mm×13 mm (diameter×length) and two-flute ball shape with a helix angle of 30°. The cutting tool bodies 4-5 had a cutting edge dimension of 10 mm×22 mm (diameter×length) and two-flute square shape.

(a) Each of the cutting tool bodies 1-5 were subjected to ultrasonic cleaning in acetone. Then, after being dried, they were mounted on the rotating table of AIP apparatus indicated in FIGS. 2A and 2B. Specifically, they were mounted at a position a certain distance away from the central shaft of the rotating table in the radius direction along the outer peripheral part of the rotating table. Then, the Ti cathode electrode for bombard cleaning was provided to one side of AIP apparatus, and the target (cathode electrode) made of 70 at % Al-30 at % Cr alloy was provided to the other side of AIP apparatus.

(b) Next, the cutting tool bodies were heated at 400° C., while the inside of the apparatus was kept in vacuum by exhausting. After the heating, direct current bias voltage of −1000V was applied to the cutting tool bodies, which were rotating and revolving on the rotating table, and arc discharge was formed by applying electrical current of 100 A between the Ti cathode electrode and the anode electrode. By following the procedure described above, the surface of the cutting tool body was bombard-cleaned.

(c) Next, magnetic fields with various intensities were applied in such a way that the integrated magnetic force from the center of the Al—Cr alloy target surface to the cutting tool body is in the range of 140-400 mT×mm.

(d) Next, nitrogen gas was introduced in the apparatus as a reaction gas to obtain the reaction atmosphere of 9.3 Pa. At the same time: the temperature of the cutting tool bodies, which were rotating and revolving on the rotating table, was kept in the range of 370-450° C.; the direct current bias voltage of −50V was applied; and arc discharge was formed by applying current of 100 A between the Al—Cr alloy target and the anode electrode. By following the above-described procedure, the hard coating layers made of the (Al, Cr)N layer, which had the compositions and the intended average layer thickness shown in Table 2, were vapor-deposited on the surface of the cutting tool bodies.

Thorough the above-explained processes (a) to (d), surface-coated end mills 1-7 (hereinafter, referred as Present Invention 1-7) were produced as coated tools of the present invention.

In ATP apparatus shown in FIGS. 2A and 2B, the cutting tool bodies were attached and supported in such a way that a part of or the entire flank face of the cutting tool body and the surface of the Al—Cr alloy target were aligned in parallel when the cutting tool body was positioned closest to the Al—Cr alloy target.

COMPARATIVE EXAMPLE

For comparison purposes, surface-coated end mills 1-5 (hereinafter, referred as Comparative Examples 1-5) of Comparative Examples were produced. They were produced in the same condition as Example 1 of the present invention except for: changing the condition (c) in Example 1 (that is, the integrated magnetic force between the center of the Al—Cr alloy target surface and the cutting tool body was set to less than 140 mT×mm, or higher than 400 mT×mm); and changing the condition (d) in Example 1 (that is, the cutting tool body was kept at less than 370° C., or higher than 450° C.). In addition, the surface-coated end mills 6-10 of Comparative Examples, in which the Cr content with respect to the total amount of Al and Cr in the hard coating layer was out of the range of 0.2-0.5, or the average layer thickness of the coating layer was out of the range of 2-10 μm, were produced.

In regard to Examples 1-7 of the present invention and Comparative Examples 1-10, the grain forms of the hard coating layer were observed in their vertical cross sections. From the observation, it was demonstrated that they were composed of the granular crystal structures with the aspect ratio of 1 or more and 6 or less. The aspect ratio was calculated by dividing the minor axis with the major axis of the crystal grain, the major axis being the longest axis (long side) in the cross section of the crystal grain, and the minor axis (short side) being the vertical axis to the major axis.

In addition, crystal grain sizes of the granular crystals were measured by a scanning electron microscope (SEM) to obtain the surface grain size and the interface grain size on the region from the cutting edge on the flank face to the location 100 μm from the cutting edge. Specifically, the surface grain size and the interface grain size were obtained by: calculating the average grain size of the crystal existing in the width of 10 μm at three locations of the cutting edge on the flank face, on the location 50 μm from the cutting edge on the flank face, and on the location 100 μm from the cutting edge on the flank face; and calculating average values from the three locations on the flank face.

Also, in the same manner, the crystal grain size length ratio of crystal grains whose size was 0.15 μm or less on the region from the cutting edge on the flank face to the location 100 μm from the cutting edge was obtained by measuring the crystal grain size length ratio of crystal grains at the total of 6 locations in the interface and the surface at: the cutting edge on the flank face, on the location 50 μm from the cutting edge on the flank face, and on the location 100 μm from the cutting edge on the flank face.

The measured and calculated values obtained by the above-described procedures are shown in Tables 2 and 3.

More details of the measurement method of the crystal grain size and the measurement method of crystal grain size length ratio of crystal grains whose size was 0.15 μm or less are as explained below.

First, the cross section of the flank face including the corner part of the front-end cutting edge of the coated tool was polished. Then, the SEM image of the polished cross section was observed. In the measurement condition, the observation magnification was set to 10000 times, and the accelerating voltage was set to 3 kV. Then, by using each of the crystal grains formed in the depth region of 0.5 μm from the surface of the hard coating layer, a straight line parallel to the surface of the cutting tool body was drawn. Then, the distance between crystal grain boundaries was defined as the grain size. The location in which the line parallel to the surface of the cutting tool body was drawn was the location where the largest crystal grain was obtained in each of the crystal grains. On the region from the cutting edge on the flank face to the location 100 μm from the cutting edge, the specific measurement points were three locations of; the cutting edge on the flank face; the location 50 μm from the cutting edge on the flank face; and the location 100 μm from the cutting edge on the flank face. In each of the three locations, crystal grain sizes of the crystals existing within the width of 10 μm were measured. Then, the surface grain size was obtained as the average value of the three locations. When the grain size within the width of 10 μm was measured, the measurement data on the center of each measurement location, on the location 5 μm toward the cutting edge side, and the location 5 μm toward the opposite side of the cutting edge side, were used. However, in the case of the measurement on the cutting edge on the flank face, the central position was set to the location 5 μm from the cutting edge, and other two locations were set to the location 5 μm from the central position toward the cutting edge side, and the location 5 μm from the central position toward the opposite side of the cutting edge side. Measurements were performed at the above-explained three positions in the width of 10 μm. In addition, in regard to the each of crystal grains formed in the region in the hard coating layer from the interface between the cutting tool body and the hard coating layer toward the hard coating layer in 0.5 μm in the thickness direction, the interface grain size was calculated in the same manner.

Also, in the measuring method of the crystal grain size length ratio of crystal grains whose size is 0.15 μm or less, all measurement data measured at the above-mentioned three locations on the interface and the three locations on the surface in the above-explained grain size measurement were used. The sum of the lengths of the crystal gain sizes having a grain size of 0.15 μm or less with respect to the sum of the total lengths of all of the measured crystal grain sizes was defined as the crystal grain size length ratio of crystal grains whose size is 0.15 μm or less.

The values of the compressive residual stress in the hard coating layer was calculated by using the peak of AlCrN (420) surface obtained by $2\theta \sin^2 \phi$ method utilizing X-ray diffraction.

The above-mentioned measured compressive residual stress values are shown in Tables 2 and 3.

In addition, the angle of cutting edges α of Examples 1-7 of the present invention and Comparative Examples 1-10, and the occupied angles β of the continuous crack formed in the hard coating layer in the corner portion of the front-end cutting edge were measured to calculate the crack occupancy ratio β/α.

These values are also shown in Tables 2 and 3.

More details of the measurement methods of the angle of cutting edges α and the occupied angles β of the continuous crack are as follows.

Among the SEM images observed for measurement of crystal grain sizes, the cross-sectional SEM images of the front-end cutting edge were used. In the measurement condition, the observation magnification was set to 10000 times, and the accelerating voltage was set to 3 kV. The cross-sectional SEM image of the front-end cutting edge of Example 3 of the present invention is shown in FIG. 4A. Also, the schematic diagram of the SEM image is shown in FIG. 4B. Hereinafter, the methods are explained in reference to FIG. 4B. In this explanation, the cutting edge on the flank face is defined as the point "A", and the cutting edge on the rake face is defined as the point "B." Then, a line passing the point A and perpendicular to the flank face is drawn. Also, a line passing the point B and perpendicular to the rake face is drawn. Then, the intersection between the two perpendicular lines was defined as the center O. The angle of cutting edge α (°) was defined as the angle formed by tracing A-O-B.

Also, in regard to the continuous crack formed in the hard coating layer in the corner part of the front-end cutting edge, the point closest to the line passing the point A and perpendicular to the flank face was defined as the point "C." Similarly, the point closest to the line passing the point B and perpendicular to the rake face was defined as the point "D." The occupied angle β (°) of the continuous crack was defined as the angle formed by tracing C-O-D. In the case where multiple cracks existed in the hard coating layer in the corner part of the front-end cutting edge, the maximum value calculated on one of the continuous cracks was defined as the occupied angle β of the continuous crack.

Finally, the value obtained by dividing the occupied angle β of the continuous crack by the angle of cutting edge α was defined as the crack occupancy ratio.

TABLE 1

| Type | Blending composition (mass %) | | | | | | | | Diameter × length (mm) of cutting edge part |
|---|---|---|---|---|---|---|---|---|---|
| | Co | (Ti, W)C | TaC | NbC | ZrC | $Cr_3C_2$ | VC | WC | |
| Cutting tool body | 1 | 5 | 5 | — | — | — | — | — | Medium-coarse grain: balance | 6 × 13 |

TABLE 1-continued

| Type | | Co | (Ti, W)C | TaC | NbC | ZrC | Cr₃C₂ | VC | WC | Diameter × length (mm) of cutting edge part |
|---|---|---|---|---|---|---|---|---|---|---|
| (end mill) | 2 | 6 | — | 1 | 0.5 | — | — | — | Micro grain: balance | 6 × 13 |
| | 3 | 6 | — | 1 | — | 1 | 0.5 | 0.5 | Micro grain: balance | 6 × 13 |
| | 4 | 8 | — | — | — | — | 0.5 | 0.5 | Micro grain: balance | 10 × 22 |
| | 5 | 9 | 25 | 10 | 1 | — | — | — | Medium-coarse grain: balance | 10 × 22 |

TABLE 2

| Type | | Cutting tool body symbol | Cutting tool body temperature (° C.) | Integrated magnetic force (mT × mm) | (Al, Cr)N layer | | | | | | | |
|---|---|---|---|---|---|---|---|---|---|---|---|---|
| | | | | | Composition (atomic ratio) | Average layer thickness (μm) | Surface grain size (μm) | Grain size difference (μm) Note 1 | Crystal grain size length ratio of crystal grains (grain size ≤0.15 μm) (%) Note 2 | Compressive residual stress in the layer (GPa) | Angle of cutting edge α (°) | Occupied angle of the continuous crack β (°) | Crack occupancy ratio (β/α) |
| Present Invention | 1 | 1 | 400 | 141.8 | Cr22Al78 | 2.7 | 0.21 | 0.02 | 19.6 | 2.65 | 103.0 | 35.0 | 0.34 |
| | 2 | 2 | 400 | 384.0 | Cr30Al70 | 8.5 | 0.33 | 0.08 | 12.0 | 2.06 | 101.0 | 101.0 | 1(*1) |
| | 3 | 3 | 400 | 200.3 | Cr41Al59 | 5.8 | 0.30 | 0.02 | 9.8 | 2.62 | 105.5 | 90.7 | 0.86 |
| | 4 | 4 | 430 | 141.8 | Cr50Al50 | 9.8 | 0.26 | 0.02 | 16.5 | 2.70 | 103.5 | 47.6 | 0.46 |
| | 5 | 5 | 430 | 384.0 | Cr28Al72 | 2.6 | 0.37 | 0.03 | 3.5 | 2.05 | 102.0 | 102.0 | 1(*1) |
| | 6 | 1 | 370 | 384.0 | Cr30Al70 | 7.7 | 0.40 | 0.04 | 3.1 | 1.92 | 104.0 | 104.0 | 1(*1) |
| | 7 | 2 | 450 | 141.8 | Cr50Al50 | 8.8 | 0.26 | 0.02 | 15.8 | 2.71 | 105.0 | 84.0 | 0.8 |

Note 1:
"Grain size difference" indicates the value obtained by subtracting the interface grain size from the surface grain size.

Note 2:
"Crystal grain size length ratio of crystal grains (gain size ≤0.15 μm)" indicates the average ratio of crystal grains whose size is 0.15 μm or less at three locations of: the cutting edge on the flank face; the location 50 μm from the cutting edge on the flank face; and the location 100 μm from the cutting edge on the flank face.
(*1)Indicated as 1 even if the crack occupancy rate is more than 1.

TABLE 3

| Type | | Cutting tool body symbol | Cutting tool body temperature (° C.) | Integrated magnetic force (mT × mm) | (Al, Cr)N layer | | | | | | | |
|---|---|---|---|---|---|---|---|---|---|---|---|---|
| | | | | | Composition (atomic ratio) | Average layer thickness (μm) | Surface grain size (μm) | Grain size difference (μm) Note 1 | Crystal grain size length ratio of crystal grains (grain size ≤0.15 μm) (%) Note 2 | Compressive residual stress in the layer (GPa) | Angle of cutting edge α (°) | Occupied angle of the continuous crack β (°) | Crack occupancy ratio (β/α) |
| Comparative Example | 1 | 1 | 370 | 0 | Cr22Al78 | 2.6 | 0.04(*1) | 0(*1) | 100(*1) | 2.91(*2) | 102.0 | 16.3 | 0.16(*3) |
| | 2 | 2 | 370 | 122.4 | Cr30Al70 | 8.5 | 0.17(*1) | −0.06(*1) | 26.7(*1) | 2.80(*2) | 102.5 | 42.0 | 0.41 |
| | 3 | 3 | 400 | 422.2 | Cr41Al59 | 5.6 | 0.71(*1) | 0.13(*1) | 10.5 | 2.06 | 104.5 | 102.4 | 0.98 |
| | 4 | 4 | 350 | 141.8 | Cr50Al50 | 9.8 | 0.02(*1) | 0(*1) | 100(*1) | 3.32(*2) | 103.0 | 4.1 | 0.04(*3) |
| | 5 | 5 | 500 | 384.0 | Cr28Al72 | 2.5 | 0.81(*1) | 0.09(*1) | 0 | 1.62(*2) | 102.5 | 100.5 | 0.98 |
| | 6 | 1 | 370 | 141.8 | Cr13Al87(*1) | 2.4 | 0.42(*1) | 0.04 | 6.24 | 2.15 | 103.0 | 103.0 | 1(*4) |
| | 7 | 2 | 370 | 384.0 | Cr60Al40(*1) | 8.5 | 0.03(*1) | −0.01(*1) | 100(*1) | 3.05(*2) | 100.0 | 12.0 | 0.12(*3) |
| | 8 | 3 | 400 | 200.3 | Cr60Al40(*1) | 5.9 | 0.04(*1) | 0.01(*1) | 100(*1) | 2.96(*2) | 102.0 | 8.2 | 0.08(*3) |
| | 9 | 4 | 450 | 141.8 | Cr50Al50 | 1.8(*1) | 0.22 | 0.02 | 18.2 | 2.52 | 100.5 | 6.0 | 0.06(*3) |
| | 10 | 5 | 450 | 384.0 | Cr28Al72 | 12.5(*1) | 0.44 | 0.05 | 2.4 | 2.04 | 101.5 | 101.5 | 1(*4) |

Note 1:
"Grain size difference" indicates the value obtained by subtracting the interface grain size from the surface grain size.

Note 2:
"Crystal grain size length ratio of crystal grains (gain size ≤0.15 μm)" indicates the average ratio of crystal grains whose size is 0.15 μm or less at three locations of: the cutting edge on the flank face; the location 50 μm from the cutting edge on the flank face; and the location 100 μm from the cutting edge on the flank face.
(*1)Indicates the parameter is out of the scope of the present invention.
(*2)Indicates the parameter is out of the range defined in the aspect (2) of the present invention.
(*3)Indicates the parameter is out of the range defined in the aspect (3) of the present invention.
(*4)Indicated as 1 even if the crack occupancy rate is more than 1.

Next, among the end mills of Examples 1-7 of the present invention and Comparative Examples 1-10, Examples 1-3, 6, and 7 of the present invention, and Comparative Examples 1-3, and 6-8, the grooving cutting test of carbon steel was performed in the condition indicated below (referred as "Cutting condition A").

Work-Planar dimension: Plate in JIS-S55C standard, 100 mm×250 mm, thickness: 50 mm
Rotation speed: 16,000 min.$^{-1}$
Vertical cutting depth: 2.3 mm
Horizontal cutting depth: 0.3 mm
Feed rate (per tooth): 0.06 mm/tooth
Cutting length: 340 m Also, among the end mills of Examples 1-7 of the present invention and Comparative Examples 1-10, Examples 4 and 5 of the present invention, and Comparative Examples 4, 5, 9, and 10, was performed the grooving cutting test of carbon steel in the condition indicated below (referred as "Cutting condition B").

Work-Planar dimension: Plate in JIS-S55C standard, 100 mm×250 mm, thickness: 50 mm
Rotation speed: 3,200 min.$^{-1}$
Vertical cutting depth: 10 mm
Horizontal cutting depth: 1 mm
Feed rate (per tooth): 0.07 mm/tooth
Cutting length: 90 m In each of cutting tests, the width of flank wear was measured.

The measurement results are shown in Table 4.

TABLE 4

| Type | | Width of flank wear (mm) | | Type | | Width of flank wear (mm) | |
|---|---|---|---|---|---|---|---|
| | | Cutting condition (A) | Cutting condition (B) | | | Cutting condition (A) | Cutting condition (B) |
| Present Invention | 1 | 0.15 | — | Comparative Example | 1 | 10 (*) | — |
| | 2 | 0.06 | — | | 2 | 30 (*) | — |
| | 3 | 0.09 | — | | 3 | 90 (*) | — |
| | 4 | — | 0.12 | | 4 | — | 30 (*) |
| | 5 | — | 0.04 | | 5 | — | 30 (*) |
| | 6 | 0.19 | — | | 6 | 300 (*) | — |
| | 7 | 0.18 | — | | 7 | 180 (*) | — |
| | | | | | 8 | 150 (*) | — |
| | | | | | 9 | — | 10 (*) |
| | | | | | 10 | — | 30 (*) |

The value marked with * in parentheses in Comparative Example column indicates the cutting length (m) until reaching to its service life (until width of flank wear reaches to 0.2 mm) by chipping or abrasion.

EXAMPLE 2

As raw material powders: the WC powder; the TiC powder; the ZrC powder; the VC powder; the TaC powder; the NbC powder; the $Cr_3C_2$ powder; the TiN powder; the TaN powder; and the Co powder, all of which had the average grain size of 1-3 μm were prepared. The above-mentioned powders were blended as in the blending composition shown in Table 1. Then, the mixtures were wet-mixed for 72 hours by a ball mill. After drying, the mixtures were press-molded at pressure of 100 MPa to obtain green compacts. The obtained green compacts were sintered in the condition of: vacuum of 6 Pa; temperature of 1400° C.; and the retaining time of 1 hour. After sintering, honing machining if R:0.03 was performed on the front-end cutting edge. Then, final polishing was performed on them. By following the above-described procedures, the cutting tool bodies 6-10 made of WC-based cemented carbide having the insert shape of SNGA120408 in ISO standard were formed.

Next, the surfaces of the cutting tool bodies (inserts) 6-10 were subjected to ultrasonic cleaning in acetone. Then, after being dried, they were inserted in AIP apparatus indicated in FIGS. 2A and 2B. Then, the surface-coated inserts of the present invention (hereinafter, referred as the present invention 8-14) were produced by forming the hard coating layer made of (Al, Cr)N layer with the composition and the intended average layer thickness shown Table 6 in the identical condition to the above-described Example 1.

COMPARATIVE EXAMPLE 2

For comparison purposes, the surface-coated inserts (hereinafter, referred as Comparative Examples 11-20) of Comparative Examples were produced by forming the hard coating layer made of (Al, Cr)N layer with the composition and the intended average layer thickness shown Table 7 in the identical condition to the above-described Comparative Example 1.

In regard to Examples 8-14 of the present invention and Comparative Examples 11-20, the grain forms of the hard coating layer were observed in their vertical cross sections. From the observation, it was demonstrated that they were composed of the granular crystal structures with the aspect ratio of 1 or more and 6 or less.

Also, in regard to Examples 8-14 of the present invention and Comparative Examples 11-20, the surface grain size and the interface grain size were obtained as in the case of Examples 1-7 of the present invention and Comparative Examples 1-10.

Also, the crystal grain size length ratio of crystal grains whose size was 0.15 μm or less on the region from the cutting edge on the flank face to the location 100 μm from the cutting edge (that is, the three locations of: the cutting edge on the flank face; the location 50 μm from the cutting edge; and the location 100 μm from the cutting edge) was measured.

Furthermore, the compressive residual stress in the hard coating layer was measured.

Also, the angle of cutting edges α, the occupied angles β of the continuous crack, and the crack occupancy ratio β/α were measured or calculated.

The above-mentioned values measured or calculated are shown in Tables 6 and 7.

TABLE 5

| | | Blending Composition (mass %) | | | | | |
|---|---|---|---|---|---|---|---|
| Type | | Co | TiC | ZrC | TaC | NbC | $Cr_3C_2$ | WC |
| Cutting tool body (insert) | 6 | 10.5 | 8 | — | 8 | 1.5 | — | Balance |
| | 7 | 7 | — | — | — | — | — | Balance |
| | 8 | 5.7 | — | — | 1.5 | 0.5 | — | Balance |
| | 9 | 5.7 | — | — | — | — | 1 | Balance |
| | 10 | 8.5 | — | 0.5 | — | — | 0.5 | Balance |

TABLE 6

| | Type | Cutting tool body symbol | Cutting tool body temperature (° C.) | Integrated magnetic force (mT × mm) | (Al, Cr)N layer Composition (atomic ratio) | Average layer thickness (μm) | Surface grain size (μm) | Grain size difference (μm) Note 1 | Crystal grain size length ratio of crystal grains (grain size ≤0.15 μm) (%) Note 2 | Compressive residual stress in the layer (GPa) | Angle of cutting edge α (°) | Occupied angle of the continuous crack β (°) | Crack occupancy ratio (β/α) |
|---|---|---|---|---|---|---|---|---|---|---|---|---|---|
| Present Invention | 8 | 6 | 400 | 141.8 | Cr22Al78 | 2.5 | 0.22 | 0.02 | 19.2 | 2.59 | 90.0 | 51.3 | 0.57 |
| | 9 | 7 | 400 | 384.0 | Cr30Al70 | 8.2 | 0.35 | 0.08 | 10.4 | 2.05 | 90.0 | 66.6 | 0.74 |
| | 10 | 8 | 400 | 200.3 | Cr41Al59 | 5.5 | 0.29 | 0.03 | 8.6 | 2.65 | 90.0 | 51.3 | 0.57 |
| | 11 | 9 | 430 | 141.8 | Cr50Al50 | 9.4 | 0.28 | 0.03 | 17.6 | 2.62 | 90.0 | 45.9 | 0.51 |
| | 12 | 10 | 430 | 384.0 | Cr28Al72 | 2.5 | 0.40 | 0.02 | 2.6 | 2.10 | 90.0 | 88.2 | 0.98 |
| | 13 | 6 | 370 | 384.0 | Cr30Al70 | 7.5 | 0.42 | 0.02 | 3.2 | 1.90 | 90.0 | 76.5 | 0.85 |
| | 14 | 7 | 450 | 141.8 | Cr50Al50 | 8.5 | 0.28 | 0.04 | 16.5 | 2.76 | 90.0 | 72.9 | 0.81 |

Note 1:
"Grain size difference" indicates the value obtained by subtracting the interface grain size from the surface grain size.

Note 2:
"Crystal grain size length ratio of crystal grains (gain size ≤0.15 μm)" indicates the average ratio of crystal grains whose size is 0.15 μm or less at three locations of: the cutting edge on the flank face; the location 50 μm from the cutting edge on the flank face; and the location 100 μm from the cutting edge on the flank face.

TABLE 7

| | Type | Cutting tool body symbol | Cutting tool body temperature (° C.) | Integrated magnetic force (mT × mm) | (Al, Cr)N layer Composition (atomic ratio) | Average layer thickness (μm) | Surface grain size (μm) | Grain size difference (μm) Note 1 | Crystal grain size length ratio of crystal grains (grain size ≤0.15 μm) (%) Note 2 | Compressive residual stress in the layer (GPa) | Angle of cutting edge α (°) | Occupied angle of the continuous crack β (°) | Crack occupancy ratio (β/α) |
|---|---|---|---|---|---|---|---|---|---|---|---|---|---|
| Comparative Example | 11 | 6 | 370 | 0 | Cr22Al78 | 2.5 | 0.04(*1) | 0(*1) | 100(*1) | 2.99(*2) | 90.0 | 17.1 | 0.19(*3) |
| | 12 | 7 | 370 | 122.4 | Cr30Al70 | 8.2 | 0.17(*1) | −0.06(*1) | 24.5(*1) | 2.83(*2) | 90.0 | 37.8 | 0.42 |
| | 13 | 8 | 400 | 422.2 | Cr41Al59 | 5.5 | 0.71(*1) | 0.13(*1) | 4.2 | 2.11 | 90.0 | 90.0 | 1(*4) |
| | 14 | 9 | 350 | 141.8 | Cr50Al50 | 9.4 | 0.02(*1) | 0(*1) | 100(*1) | 2.84(*2) | 90.0 | 7.2 | 0.08(*3) |
| | 15 | 10 | 500 | 384.0 | Cr28Al72 | 2.5 | 0.81(*1) | 0.09(*1) | 0 | 1.79(*2) | 90.0 | 90.0 | 1(*4) |
| | 16 | 6 | 370 | 141.8 | Cr13Al87(*1) | 2.5 | 0.42(*1) | 0.04 | 7.62 | 2.03 | 90.0 | 90.0 | 1(*4) |
| | 17 | 7 | 370 | 384.0 | Cr60Al40(*1) | 8.2 | 0.03(*1) | −0.01(*1) | 100(*1) | 3.21(*2) | 90.0 | 5.4 | 0.06(*3) |
| | 18 | 8 | 400 | 200.3 | Cr60Al40(*1) | 5.5 | 0.04(*1) | 0.01(*1) | 100(*1) | 3.04(*2) | 90.0 | 4.5 | 0.05(*3) |
| | 19 | 9 | 450 | 141.8 | Cr50Al50 | 1.5(*1) | 0.22 | 0.02 | 18.2 | 2.67 | 90.0 | 5.4 | 0.06(*3) |
| | 20 | 10 | 450 | 384.0 | Cr28Al72 | 12(*1) | 0.44 | 0.05 | 3.2 | 2.05 | 90.0 | 90.0 | 1(*4) |

Note 1:
"Gram size difference" indicates the value obtained by subtracting the interface grain size from the surface grain size Note 2:
"Crystal grain size length ratio of crystal grains (gain size ≤0.15 μm)" indicates the average ratio of crystal grains whose size is 0.15 μm or less at three locations of: the cutting edge on the flank face; the location 50 μm from the cutting edge on the flank face; and the location 100 μm from the cutting edge on the flank face.
(*1)Indicates the parameter is out of the scope of the present invention.
(*2)Indicates the parameter is out of the range defined in the aspect (2) of the present invention.
(*3)Indicates the parameter is out of the range defined in the aspect (3) of the present invention.
(*4)Indicated as I even if the crack occupancy rate is more than 1.

Next, under the condition indicated below (referred as "Cutting condition C"), a continuous dry cutting test of alloy steel was performed on Examples 8-14 of the present invention and Comparative Examples 11-20 in the state where each of the inserts were screwed on the front-end part of the steel made tool bite with a fixture.
Work: Round bar in JIS-SCM440 standard
Cutting speed: 150 m/min.
Cutting depth: 1.5 mm
Feed rate: 0.6 mm/rev.
Cutting time: 3 minutes
After the test, the width of flank wear was measured.

The measurement results are shown in Table 8.

TABLE 8

| Type | | Width of flank wear (mm) Cutting condition (C) | Type | | Width of flank wear (mm) Cutting condition (C) |
|---|---|---|---|---|---|
| Present Invention | 8 | 0.12 | Comparative Example | 11 | 0.5 (*) |
| | 9 | 0.07 | | 12 | 2 (*) |
| | 10 | 0.06 | | 13 | 2.5 (*) |

TABLE 8-continued

| Type | Width of flank wear (mm) Cutting condition (C) | Type | Width of flank wear (mm) Cutting condition (C) |
|---|---|---|---|
| 11 | 0.09 | 14 | 2 (*) |
| 12 | 0.03 | 15 | 2 (*) |
| 13 | 0.18 | 16 | 2.8 (*) |
| 14 | 0.17 | 17 | 2.5 (*) |
|  |  | 18 | 2.5 (*) |
|  |  | 19 | 0.5 (*) |
|  |  | 20 | 2.5 (*) |

The value marked with * in parentheses in Comparative Example column indicates the cutting time (min) until reaching to its service life (until width of flank wear reaches to 0.2 mm) by chipping or abrasion.

Based on the results shown in Tables 4 and 8, it was demonstrated that the coated cutting tools of the present invention exhibited excellent chipping resistance and abrasion resistance in cutting machining of carbon steel, alloy steel, or the like due to: setting the surface and intermediate grain sizes of the hard coating layer made of (Al, Cr)N layer within the specific numerical range; setting the crystal grain size length ratio of crystal grains whose size is 0.15 μm or less on the region from the cutting edge on the flank face to the location 100 μm from the cutting edge to 20% or less; setting the compressive residual stress in the hard coating layer to 2.0-2.7 GPa; and setting the crack occupancy ratio to 0.3-1.0.

Contrary to that, it was clearly demonstrated that Comparative Examples, in which the structure of the hard coating layer did not satisfy the ranges defined in the present invention, reached to their service lives in a relatively short period of time due to occurrence of chipping or reduction of abrasion resistance.

INDUSTRIAL APPLICABILITY

As explained above, the coated cutting tool of the present invention exhibits an excellent cutting performance for long-term use when it used for cutting work of carbon steel, alloy steel, or the like. Thus, the present invention sufficiently contributes to: making the cutting machine applicable to factory automation; energy and labor saving in cutting work; and reduction of cost.

BRIEF DESCRIPTION OF THE REFERENCE SYMBOLS

1: Arc ion plating apparatus
2: Chamber
3: Rotating table
4: Cemented carbide body
5: Heater
6: Anode electrode
7: Cathode electrode
8: Magnetic force generating source
9: Reaction gas inlet
10: Exhaust gas outlet
11: Bias power supply
12: Arc power supply
13: Surface-coated cutting tool
14: Cutting tool body
15: Hard coating layer
16, A: Cutting edge on the flank face
B: Cutting edge on the rake face
17: Region from the cutting edge 16 on the flank face to the location 100 μm from the cutting edge 16
18: Interface between the cutting tool body and the hard coating layer on the region 16
19: Surface of the hard coating layer formed on the region 16
20: Hard coating layer formed on the region 16
21A: Flank face on the cutting tool body
21B: Flank face of the coated tool
22A: Rake face on the cutting tool body
22B: Rake face of the coated tool
23: Intersection of extended lines of the flank face 21 and the rake face 22 on the cutting tool body
L: Distance from the intersection 23 to the cutting edge 16 on the flank face (μm)
R: Curvature radius of the corner portion
θ: Angle formed between the flank face 21 of the cutting tool body and the rake face 22 of the cutting tool body in degree
α: Angle of cutting edge of the coated cutting tool in degree
β: Occupied angle of the continuous crack formed in the hard coating layer within the angular range of α in degree
O: Center
A: Cutting age on the flank face
B: Cutting edge on the rake face
C, D: End of the crack
CR1: Crack with the maximum angle β within the angle of cutting edge α
CR2, CR3: Crack

The invention claimed is:

1. A surface-coated cutting tool comprising:
a cutting tool body made of tungsten carbide-based cemented carbide; and
a hard coating layer that has an average thickness of 2 μm to 10 μm and is vapor-deposited on a surface of the cutting tool body, wherein
the hard coating layer is made of a complex nitride layer of Al and Cr, a Cr content with respect to a total amount of Al and Cr being 0.2 to 0.5 in atomic ratio;
a part of the hard coating layer, which is vapor deposited on a region of a flank face from a cutting edge on a flank face of the cutting tool body of the surface-coated cutting tool to a location 100 μm from the cutting edge on the flank face toward an opposite side thereof, has a granular crystal structure: an average grain size of granular crystals on a surface of the part of the hard coating layer formed on the region is 0.2 μm to 0.5 μm; an average grain size of granular crystals at an interface between the cutting tool body and the part of the hard coating layer on the region is smaller than the grain size of granular crystals on the surface of the part of the hard coating layer by 0.02 μm to 0.1 μm; a crystal grain size length ratio of crystal grains whose size is 0.15 μm or less is 20% or less,
a compressive residual stress in the hard coating layer is 2.0 to 2.7 GPa,
a crack occupancy ratio β/α is 0.3 to 1.0, α being an angle of the cutting edge of the surface-coated cutting tool in degrees, and β being an occupied angle of a continuous crack formed in the hard coating layer in a corner portion of a front-end cutting edge within the angle defined by α,
a minimum width of the continuous crack being 30 nm, and an aspect ratio of crystal grains included in the granular crystal structure is 1 or more and 6 or less.

2. The surface-coated cutting tool according to claim 1, wherein the crack occupancy ratio $\beta/\alpha$ is 0.3 to 0.9.

3. The surface-coated cutting tool according to claim 1, wherein the crack occupancy ratio $\beta/\alpha$ is 0.4 to 0.85.

4. A method of producing a surface-coated cutting tool having a cutting tool body, which is made of tungsten carbide-based cemented carbide, and a hard coating layer, which has an average thickness of 2 µm to 10 µm and is vapor-deposited on a surface of the cutting tool body, the method comprising the steps of:

inserting the cutting tool body made of tungsten carbide-based cemented carbide in an arc ion plating apparatus with an anode electrode, a target made of Al—Cr alloy, and a magnetic force generating source provided on a back side of the target; and vapor-depositing the hard coating layer made of a complex nitride layer of Al and Cr on the cutting tool body, wherein the step of vapor-depositing comprises the steps of:

introducing nitrogen gas in the arc ion plating apparatus;

forming a magnetic field between the target and the cutting tool body by the magnetic force generating source;

generating arc discharge between the target and the anode electrode while bias voltage is applied on the cutting tool body; and rotating and revolving the cutting tool body in the arc ion plating apparatus, and a part of or an entire flank face of the cutting tool body and a surface of the target facing the cutting tool body are supported to be aligned in parallel when the cutting tool body and the target come closest, the magnetic field is set to 140 to 400 mT×mm as an integrated magnetic force, the hard coating layer is made of a complex nitride layer of Al and Cr, a Cr content with respect to a total amount of Al and Cr being 0.2 to 0.5 in atomic ratio, a part of the hard coating layer, which is vapor deposited on a region on a flank face from a cutting edge on a flank face of the cutting tool body of the surface-coated cutting tool to a location 100 µm from the cutting edge on the flank face toward an opposite side thereof, has a granular crystal structure: an average grain size of granular crystals on a surface of the part of the hard coating layer formed on the region is 0.2 µm to 0.5 µm; an average grain size of granular crystals at an interface between the cutting tool body and the part of the hard coating layer on the region is smaller than the grain size of granular crystals on the surface of the part of the hard coating layer by 0.02 µm to 0.1 µm; a crystal grain size length ratio of crystal grains whose size is 0.15 µm or less is 20% or less, a compressive residual stress in the hard coating layer is 2.0 to 2.7 GPa, a crack occupancy ratio $\beta/\alpha$ is 0.3 to 1.0, $\alpha$ being an angle of the cutting edge of the surface-coated cutting tool in degrees, $\beta$ being an occupied angle of a continuous crack formed in the hard coating layer in a corner portion of a front-end cutting edge within the angle defined by $\alpha$, and a minimum width of the continuous crack being 30 nm, and an aspect ratio of crystal grains included in the granular crystal structure is 1 or more and 6 or less.

* * * * *